United States Patent [19]

Phan

[11] Patent Number: 4,740,760

[45] Date of Patent: Apr. 26, 1988

[54] CIRCUIT TECHNIQUE FOR ELIMINATING IMPACT IONIZATION IN A DIFFERENTIAL PAIR USED IN AN OUTPUT STAGE

[75] Inventor: Christina P. Phan, Santa Clara, Calif.

[73] Assignee: National Semiconductor Corporation, Santa Clara, Calif.

[21] Appl. No.: 930,787

[22] Filed: Nov. 14, 1986

[51] Int. Cl.[4] .......................... H03F 1/52; H03F 3/45
[52] U.S. Cl. ............................... 330/253; 307/200 B; 330/261; 330/298
[58] Field of Search .................... 330/207 P, 253, 255, 330/257, 261, 298; 307/200 B, 568

[56] References Cited

U.S. PATENT DOCUMENTS 4,460,874  7/1984  Haque ................................ 330/261

FOREIGN PATENT DOCUMENTS 96906  5/1985  Japan ..................................... 330/253

Primary Examiner—James B. Mullins
Attorney, Agent, or Firm—Limbach, Limbach & Sutton

[57] ABSTRACT

An additional device is provided in parallel with one of the input devices of a differential pair. A fixed bias voltage, which is slightly less than the midpoint of the swing range of the input voltage to the differential pair, is applied to the gate of the added device. During the positive swing of the input, the added device remains off and does not effect performance. When the input voltage becomes lower than the fixed bias voltage, the added device turns on and conducts all current needed by the current source, leaving the differential input devices off, and eliminating impact ionization in the differential pair.

2 Claims, 1 Drawing Sheet

CIRCUIT TECHNIQUE FOR ELIMINATING IMPACT IONIZATION IN A DIFFERENTIAL PAIR USED IN AN OUTPUT STAGE

BACKGROUND OF THE INVENTION

1. Field of the Invention

The present invention relates to semiconductor integrated circuits and, in particular, to a circuit for eliminating impact ionization in a differential pair used in an output stage.

2. Discussion of the Prior Art

State-of-the-art CMOS technology offers high density circuit elements, thus making it possible to implement complex functions, analog as well as digital, in modest chip area. Nevertheless, existing CMOS processes have certain disadvantages. One major disadvantage is the low voltage specification that limits the drain-to-source voltage $V_{ds}$ of N-type MOS transistors. As the voltage $V_{ds}$ exceeds the allowable level, the total drain current of the device increases substantially due to the contribution of the above-normal drain-to-bulk leakage current. This phenomenon is known as impact ionization and can cause damage to the device.

In a differential pair in an output stage, this limitation has required complicated modifications of the basic circuit to eliminate the problem.

SUMMARY

The present invention provides a technique for eliminating the effects of impact ionization in a differential pair used in an output stage.

For example, a typical amplifier circuit includes both an input stage consisting of a differential to single-ended converter and a gain stage and an output stage consisting of a differential pair and a voltage follower. The input transistors of the differential pair are susceptible to impact ionization. In accordance with the present invention, an additional transistor is provided in parallel with the one of the input devices. The additional device has a fixed bias voltage applied to its gate. The fixed bias voltage is slightly less than the mid-point of the swing range of the input voltage to the output stage. During the positive swing of the input, the added device remains off and does not effect circuit performance. However, when the voltage at the input becomes lower than the fixed bias voltage, the devices turns on and conducts all current needed by the current source, leaving the differential input devices off. Thus, drain-to-source voltage is clamped to an allowable value across the added device and the problem of impact ionization in the differential pair is eliminated.

DETAILED DESCRIPTION OF A PREFERRED EMBODIMENT

Figure 1A:
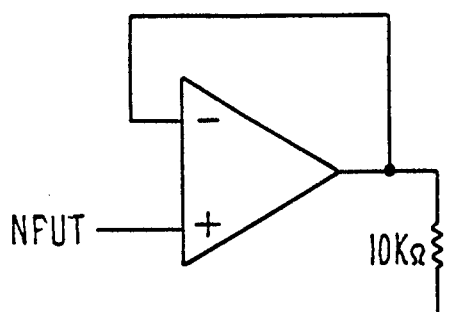
FIG. 1A is a simple circuit schematic illustrating a conventional unity-gain amplifier.
Figure 1B:
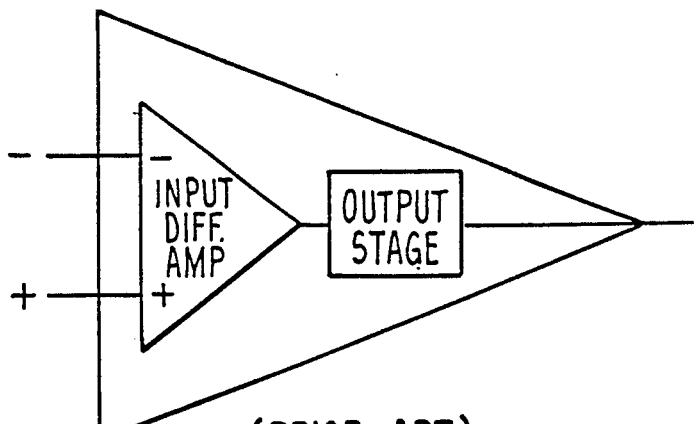
FIG. 1B is a simple circuit schematic illustrating a conventional input differential stage and an output stage of the FIG. 1A amplifier.

Referring to FIGS. 1A and 1B, the amplifier illustrated therein is intended to provide a ±3.1 v output swing in a unity-gain configuration with a 10 kohm ohm resistive load. The input stage consists of a differential to single-ended converter and a gain stage that together yield high gain (typically about 85 db) to the front end or eventually the whole amplifier. In order to protect the input stage from gain degradation caused by resistive loading at the output node, an output buffer is inserted between the two.

Figure 2:
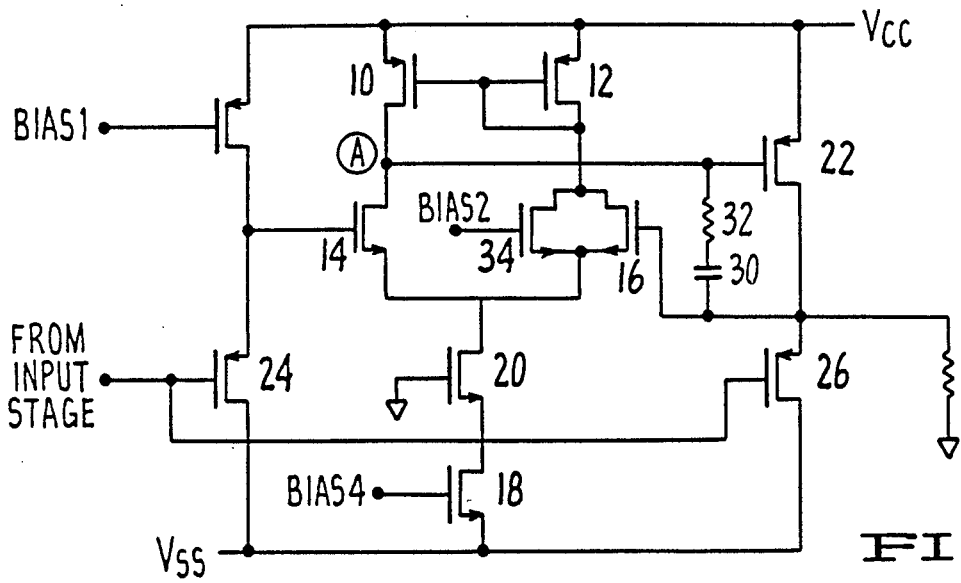
FIG. 2 is a schematic diagram illustrating an output stage in accordance with the present invention.
Figure 3:
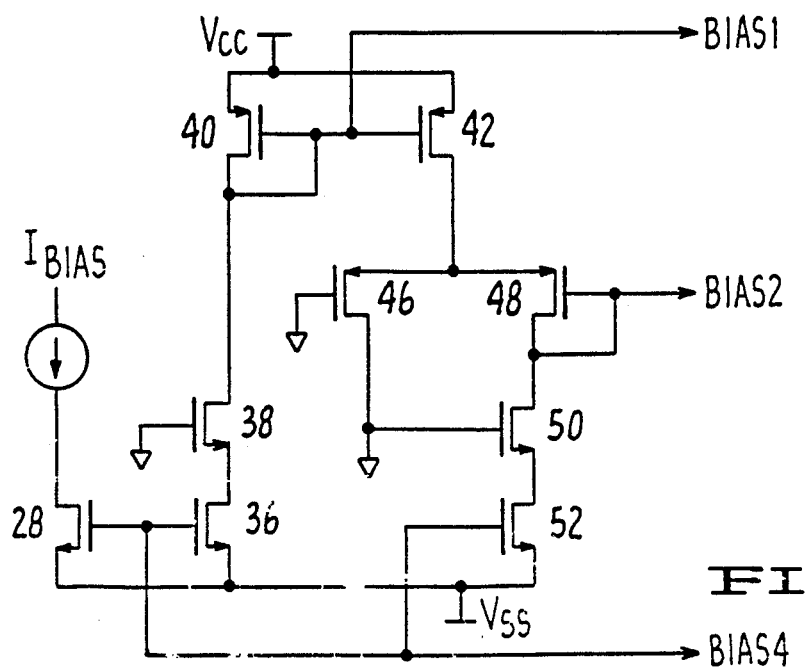
FIG. 3 is a schematic diagram illustrating a bias circuit for providing a fixed bias voltage in accordance with the present invention.

Referring to FIG. 2, the illustrated output stage includes devices 10, 12, 14, 16, 18, 20 and 22 and a voltage follower which includes devices 24 and 26. Differential pair 14,16 receives the signal from the input stage. Devices 10 and 12 form a current mirror that performs the differential to single-ended conversion of the differential stage. The current source is generated by using device 18 as a current mirror. As shown in FIG. 3, device 18 mirrors the current from a bias generator through the gate bias and scales it accordingly based on the ratio of its size with respect to that of device 28. Device 20 is used in series with device 18 to reduce the $V_{ds}$ across device 20, thus minimizing the impact ionization that will occur in device 20 when the input swings high. (This technique is described and claimed in copending and commonly-assigned U.S. patent application Ser. No. 930,869, filed by J. Wieser of even date herewith).

During the positive swing at the input, the differential pair 14,16 assumes control over the output stage. Device 22 turns on, mirrors current from device 12, scales it up and delivers it to the load. As the input level goes down, the role of the differential pair 14,16 becomes less and less important while device 26 takes over control and sinks the current that comes from the load.

For the amplifier as a whole to remain stable, the differential pair 14,16 of the output stage has to be stable itself and must be compensated. The compensation scheme is performed by capacitor 30 and resistor 32 located in series between the high impedance node A and the output node.

As the input voltage to the output stage swings down, less gate drives are applied to the inputs of the differential pair 14,16. Yet the currents through these two branches are needed for the tail current source, i.e. devices 18 and 20, to stay biased. To satisfy this condition, the voltage at the source of devices 14 and 16 must follow the gate down to produce enough $V_{gs}$ for that current. This situation results in high $V_{ds}$ on the input devices 14 and 16. As mentioned above, as a result, impact ionization occurs and may damage these devices.

In accordance with the present invention, to overcome impact ionization in the differential pair of an output stage, device 34 is added in parallel with device 16 with a fixed bias voltage applied to its gate. The bias voltage is chosen such that it is slightly below the midpoint of the swing's range where the transition of control on the output stage takes place between the differential pair 14,16 and the voltage follower 24,26. During the positive swing of the input, device 34 is off and has no effect on circuit operation. However, as soon as the voltage at the input becomes lower than this bias voltage, device 34 turns on and conducts all the current needed by the current source, leaving devices 14 and 16 totally off. The $V_{ds}$ is now clamped to an allowable value across device 34, and the problem of impact ionization on the input devices 14 and 16 is eliminated.

The bias voltage BIAS$_2$ applied to the gate of device 34 is generated by the bias circuit shown in FIG. 3. An external current $I_{BIAS}$ is applied to this bias circuit to provide current. Devices 28, 36, 38 and 40 mainly perform as current mirrors and set up bias lines to various locations in circuit. The bias voltage BIAS$_2$ at the gate of device 34 is generated by devices 42, 46, 48, 50 and 52. The gate of device 46 is tied to ground to assure that Node B is always at about a threshold $V_T$ higher than ground. As a result, the gate of device 48 is always less than ground (which is the mid-point of the swing's range) because device 48 is designed to be a weaker device compared to device 46 and has to conduct a higher current level.

In summary, by using the simple circuit technique of the present invention, the impact ionization that occurs in the differential pair of an input stage can be eliminated. This technique eliminates the problem without effecting circuit performance. On the other hand, its implementation is simple and cost-effective since it requires only a few devices to generate the bias circuit.

It should be understood that various alternatives to the embodiment of the invention described herein may be employed in practicing the invention. It is intended that the following claims define the invention and that circuits within the scope of these claims and their equivalents be covered thereby.

What is claimed is:

1. In a differential pair of the type used in an output stage of an amplifier and comprising first and second MOS transistors, the improvement comprising means for substantially eliminating impact ionization in the differential pair, said impact ionization elimination means comprising:
   a third MOS transistor connected in parallel with one of the MOS transistors; and
   means for applying a fixed bias voltage to the gate of the third MOS transistor, the fixed bias voltage being slightly less than the midpoint of the swing range of the input voltage to the amplifier output stage such that during the positive swing of the input voltage the third MOS transistor is off and when the input voltage is less than the fixed bias voltage the third MOS transistor is on and the first and second MOS transistors are off.

2. In an amplifier which includes
   (a) an input stage comprising
      a differential to single-ended converter which receives first and second input signals and provides a single-ended output signal; and
      a gain stage which receives the converter output signal and yields a high gain output; and
   (b) an output stage comprising
      a differential pair which receives the high gain output from the gain stage and provides an amplifier output signal to an amplifier load, the differential pair comprising first and second MOS transistors; and
      voltage follower means responsive to the voltage level of the high gain output to sink current from the load when the voltage level of the single-ended output signal goes down,
   the improvement comprising a third MOS transistor connected in parallel with one of the first or second MOS transistors of the differential pair, the third MOS transistor having a fixed bias voltage being slightly less than the midpoint of the swing range of the input voltage to the amplifier output stage such that during the positive swing of the input voltage the third MOS transistor is off and when the input voltage is less than the fixed bias voltage the third MOS transistor is on such that impact ionization in the first and second MOS transistors is substantially eliminated.

* * * * *